United States Patent

Gunther et al.

[11] Patent Number: 5,930,120
[45] Date of Patent: Jul. 27, 1999

[54] SHIELDED MODULE SUPPORT STRUCTURE

[75] Inventors: Hans-Ulrich Gunther, Pfinztal; Paul Mazura, Karlsbad; Volker Haag, Bad Wildbad; Klaus Pfeifer, Karlsruhe; Klaus-Michael Thalau, Malsch; Michael Joist, Gaggenau; Udo Weiss, Straubenhardt, all of Germany

[73] Assignee: Schroff GmbH, Straubenhardt Deutschland, Germany

[21] Appl. No.: 08/957,169

[22] Filed: Oct. 24, 1997

[30] Foreign Application Priority Data

Oct. 25, 1996 [DE] Germany .......................... 196 44 414

[51] Int. Cl.$^6$ ...................................................... H05K 9/00
[52] U.S. Cl. .......................... 361/800; 361/753; 361/800; 361/816; 174/35 R
[58] Field of Search ..................................... 361/724, 726, 361/727, 752, 759, 796, 800, 801, 802, 816, 818, 753; 206/706, 719; 211/41.17; 174/35 R, 35 GC

[56] References Cited

FOREIGN PATENT DOCUMENTS

| | | |
|---|---|---|
| 3039681 | 4/1984 | Germany . |
| 9106954 | 11/1991 | Germany . |
| 41 10 800 C1 | 7/1992 | Germany . |
| 0517135 A1 | 12/1992 | Germany . |
| 41 26 576 A1 | 2/1993 | Germany . |
| 0415246 B1 | 9/1995 | Germany . |
| 296 02 426 U1 | 5/1996 | Germany . |

OTHER PUBLICATIONS

Rittal Brochure, Rittal Ripac nach den neuseten internationalen Standards, Apr. 1996, pp. 5–6.
Rapid Brochure, Befestigungstechnologie, pp. 5–6, 7–9.
Two pages of a Rittal brochure (no date is provided).

*Primary Examiner*—Leo P. Picard
*Assistant Examiner*—Jayprakash N. Gandhi
*Attorney, Agent, or Firm*—Merchant & Gould P.C.

[57] ABSTRACT

A shielded module support structure 1 for printed circuit boards 2 which can be inserted on guide rails 7 and having electrical or electronic components is proposed comprising at least four module rails 4 for mounting the guide rails 7. The printed circuit boards 2 are assembled into plug-in modules 10, each having a front plate 9, wherein the front plates 9 are attached to a threaded-hole-strip using screws, the threaded-hole-strips seating in a groove 11, opening towards the front side of the module support structure 1, in the front module rail 4. In order to assure shielding of the module support structure 1 against interfering radio frequency fields, the front plates 9 are contacted with the module rails 4 using specially formed resilient contact bands 15 which can be snapped onto a seating surface 12 of the module rails 4. The resilient contact bands 15 have a plurality of break-outs 18 resiliently facing the front side of the module support structure 1 as well as a plurality of contact spikes 19 facing the seating surface 12. The resilient contact bands 15 preferentially consist essentially of flat sheet metal the upper edge 16 of which is bent for engagement into an upper engagement groove 13 and the lower edge 17 of which is bent for engagement into a lower engagement groove 14.

16 Claims, 3 Drawing Sheets

SHIELDED MODULE SUPPORT STRUCTURE

BACKGROUND OF THE INVENTION

The invention concerns a shielded module support structure for printed circuit boards which can be inserted on guide rails and having electrical or electronic components. The module support structure comprises two parallel metallic side walls and at least four parallel metallic module rails connecting the side walls and bearing the guide rails. The printed circuit boards are assembled into plug-in modules, each having a front plate, which can be inserted and removed, wherein the front module rails each have a groove opening towards the front of the module support structure for accepting a threaded-hole-strip and each also having at least one seating surface for the front plates of the plug-in modules.

Electronic circuits, in particular digital ones, have increasingly lower switching thresholds and are sensitive to interfering ambient radio frequency fields. For this reason, module support structures having printed circuit boards bearing this kind of sensitive circuitry must be shielded at all sides. Towards this end, one uses radio frequency sealed side walls and upper and lower sheet metal as well as rear covers. Shielding with respect to interfering radio frequency fields in the region of the front plate is, however, more problematic since individual printed circuit boards should be removable at any time. Particularly when the module support structure does not have a common front plate extending over the entire width of the module support structure, rather accepts plug-in modules having the inserted printed circuit boards mounted to individual front plates, the gaps between the front plates and the module support structure cause special problems, particularly at the module rails.

Shielding of the vertical gaps between the front plates and between the front plates and the side walls is usually effected using resilient elements as e.g. described in the patent publication DE 41 10 800 C1, due to the applicant. Herein, resilient metallic elements are placed on the legs of a U-shaped front plate and press against the neighboring front plate or against the side wall of the module support structure when the plug-in module is inserted to thereby effect the required low resistance area contact.

The most differing of approaches have been taken for the horizontal contacting of the front plates to the module rails. Known in the art from e.g. DE 41 26 576 A1 is a resilient element which is inserted into the groove, opening towards the front, of a module rail and seats in a widened portion of the groove disposed in front of the threaded-hole-strip. The resilient element comprises an angled strip which protrudes in a forward direction beyond the groove in the module rail and is displaced towards the threaded-hole-strip by the front plate in opposition to an elastic resilient force when the plug-in module is inserted.

A contact element is also known in the art from DE 296 02 426 U1 which seats in the groove, opening towards the front, of a module rail and is disposed in front of the threaded-hole-strip. In this prior art, the contact with the front plate of the plug-in module is effected via periodically disposed contact spikes projecting in a forward direction beyond the module rail.

The conventional contact elements have the common feature that they seat in the grooves of the module rails between the front plate and the threaded-hole-strip. The screws for securing the plug-in modules must therefore be screwed-in through the contact elements into the threaded-hole-strip. The contact elements must therefore have holes matched with the pattern of the threaded-hole-strips. In addition, these holes must align with the threaded holes. This requires a significant amount of additional effort when assembling a module support structure of this kind.

In addition to the introduction of contact elements in the groove of a module rail, it is also in principle possible to provide the seating surfaces of the module rails with contact elements. One must thereby take into account the fact that the seating surfaces of the module rails serve as contact surfaces for plug-in module removal means. With plug-in modules having triple-row equipped, 96-terminal plugs, the removal force exercised by a plug-in module removal means of this kind on the seating surface of the module rail can assume values of up to 100 N. The developments in electronic printed circuit boards will thereby lead to an additional increase in the necessary removal forces in the near future.

Conventional shielding elements disposed in the region of the seating surface of the module rails are therefore glued to the inside of the front plate and the removal means region is cut-away. This approach requires a very precise gluing of the shielding elements, since they must precisely seat on the seating surface of the module rails when the plug-in module is inserted.

SUMMARY OF THE INVENTION

It is therefore the underlying purpose of the present invention to further improve a shielded module support structure of the above mentioned kind in such a manner that a connection, shielding interfering radio frequency fields, between the front plates of the plug-in modules and the module rails is guaranteed in a simple but effective manner. The module rail grooves between the front plates and the threaded-hole-strip must thereby remain free and damage to the contact elements via plug-in module removal means should be ruled out.

This purpose is achieved by a shielded module support structure having the features of claim 1.

Advantageous configurations and improvements in the invention are described in claims 2 through 9.

In accordance with the invention, the module rails of a shielded module support structure of the above mentioned kind are therefore modified in such a manner that they each have an upper and a lower engagement groove behind their seating surfaces. In order to secure contact between the front plates and the module rails, resilient contact bands are provided for which can be snapped onto the seating surfaces of the module rails. They engage behind the seating surfaces at the top and bottom to elastically snap into the engagement grooves. The resilient contact bands have a plurality of break-outs resiliently facing towards the front of the module support structure as well as a plurality of contact spikes facing towards the seating surface. With this type of resilient contact band, which can be mounted by a simple snapping onto the module rail, it is even possible to retrofit a module support structure in the region of the front plate in a radio frequency-sealed manner.

The resilient configuration of the break-outs of the resilient contact bands requires that the front plates of the plug-in modules be pushed against the module rails in opposition to the resilient force of the break-outs. The break-outs are thereby elastically deformed and penetrate into the surface of the inner side of the front plates to assure establishment of electrical contact, even through an oxide layer. The sharp-edged contact spikes on the back of the resilient contact bands are simultaneously pressed against the seating surfaces of the module rails to assure contact to the module rails.

In particular, when the resilient contact bands in accordance with the invention consist essentially of sheet metal whose upper and lower edges are bent-over in such a manner that they engage into the associated engagement grooves of the module rails, damage to the resilient contact bands by a removal means is extremely unlikely. The flat regions of the resilient contact bands cannot be damaged by removal of a plug-in module. Since the break-outs and the contact spikes are only disposed at certain separations on the resilient contact band, there is a large probability that a plug-in module removal means bears on a flat section of a resilient contact band.

It is possible to completely avoid damage to the resilient contact bands by removal means if the break-outs of the resilient contact bands consist essentially of a substantially vertical cut and two triangular-shaped leaf springs bent-away therefrom. The leaf springs are advantageously thereby adapted to remain within an elastic deformation region of the leaf springs during pressing onto the seating surface of the module rails. Since plug-in module removal means normally function in such a manner that they bear with vertical roll-off on the seating surface of the module rail, manufacture of the break-outs via a vertical cut which provides no resistance to the pushing-off motion of the removal means is advantageous. Should a removal means bear on the resilient contact band precisely at the location of a break-out, the triangular shaped bent leaf springs simply give way elastically and are not damaged.

The contact spikes of the resilient contact bands can be manufactured in a simple manner using sharp-edged material protuberances.

If the resilient contact bands consist essentially of a plurality of equal sections between each of which an intended breaking location is disposed, it is possible to manufacture a continuous resilient contact band which can be shortened in each case to the required length when the module support structure is radio frequency shielded. The intended breaking locations thereby facilitate the breaking-off of the resilient contact band to the desired length with bare hands.

If the lower edge of the resilient contact band is extended via an abutment diagonal, the handling during the snapping of a resilient contact band onto a module rail is improved.

The resilient contact bands are preferentially made from chrome-nickel steel. This material does not corrode, has a high intrinsic elasticity as well as good conductivity and contacts very well with aluminum, preferentially used as the material for the module rails and the front plates.

Particular advantages result when the seating surfaces of the module rails are, at least in sections, milled-smooth or polished. This is true since the module rails are usually made from anodized aluminum profiled structures having a hard, resistant surface. An anodized aluminum surface is scratch-resistant. Moreover, there is little chance of irregular corrosion during transport or storage. An anodized aluminum surface has, however, the disadvantage that the anodized layer has low electrical conductivity. For module support structures shielded against interfering radio frequency fields, module rails have been utilized to date which are completely chemically freed of the anodized layer following processing.

In contrast thereto, if only the seating surfaces provided for contacting the module rails to the front plates are mechanically freed from their anodized layer by milling or polishing, a module support structure having module rails post-processed in this manner can also be retroactively radio frequency shielded. This is an additional significant improvement over prior art in accordance with which either a completely anodized profiled aluminum structure or, alternatively, profiled aluminum structures completely freed of the anodized layer were utilized as module rails.

An embodiment of the invention is more closely described below with reference to the accompanying drawing.

DESCRIPTION OF THE PREFERRED EMBODIMENT

Figure 1:
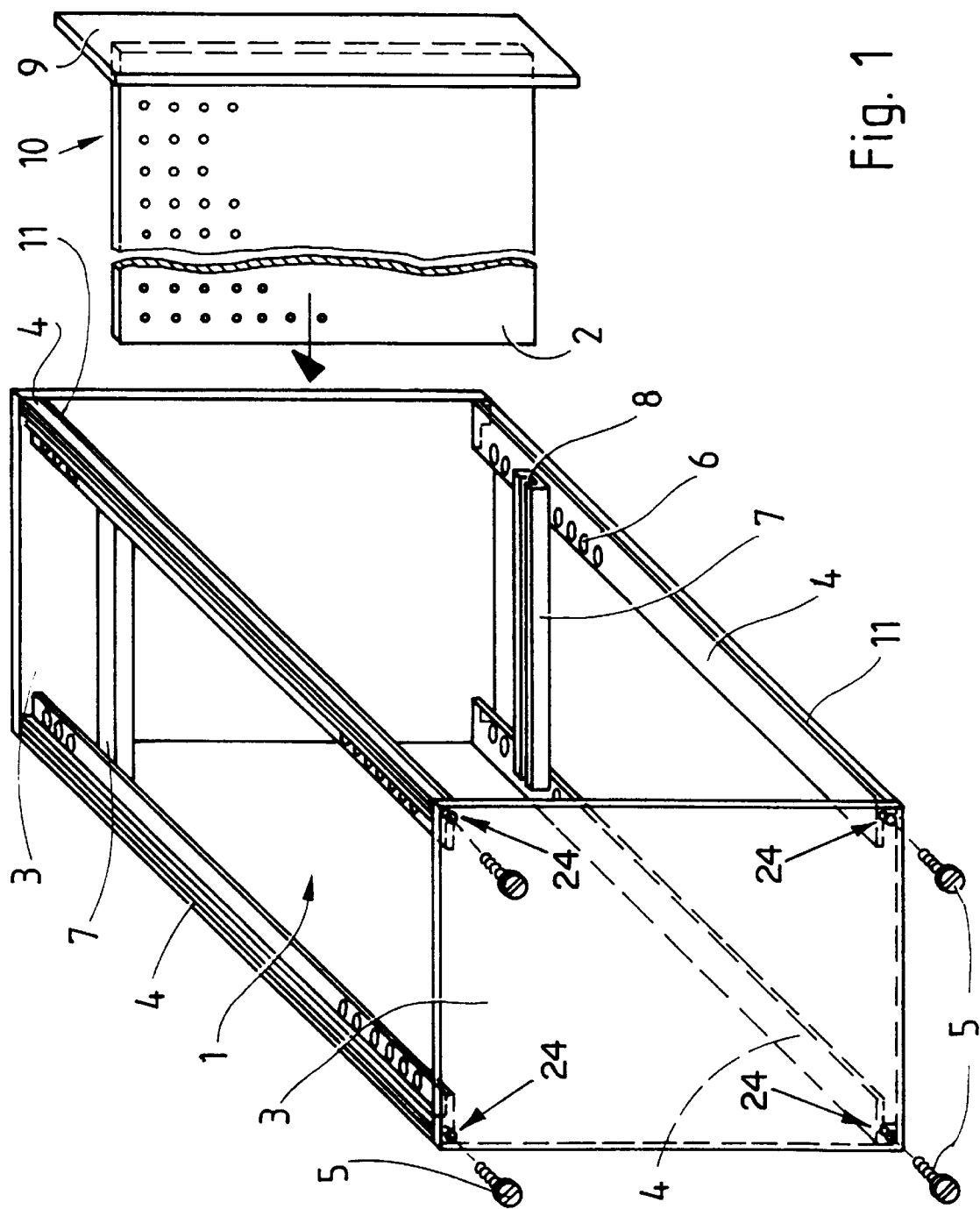
FIG. 1 shows a schematic view of a module support structure.

FIG. 1 shows a perspective schematic view of a module support structure 1 for acceptance of printed circuit boards 2 having electronic components (not shown). The module support structure 1 shown comprises two side walls 3 and four module rails 4 which connect the side walls 3 and are attached to same via mounting bolts 5. The module rails 4 have slotted holes 6 disposed in a particular separation pattern into which upper and lower guide rails 7 can be inserted. Each guide rail 7 has a guide groove 8 for acceptance of the printed circuit boards 2. The printed circuit board 2 shown, illustrated in a shortened manner for reasons of clarity, is mounted to a front plate 9 and forms, together therewith, a plug-in module 10. The front module rails 4 have a forwardly facing groove 11 includes a threaded-hole-strip 24.

The upper and lower plates as well as a rear cover and additional front plate elements, which must also clearly be present to effect shielding against interfering radio frequency fields, are not shown in FIG. 1.

Figure 2:
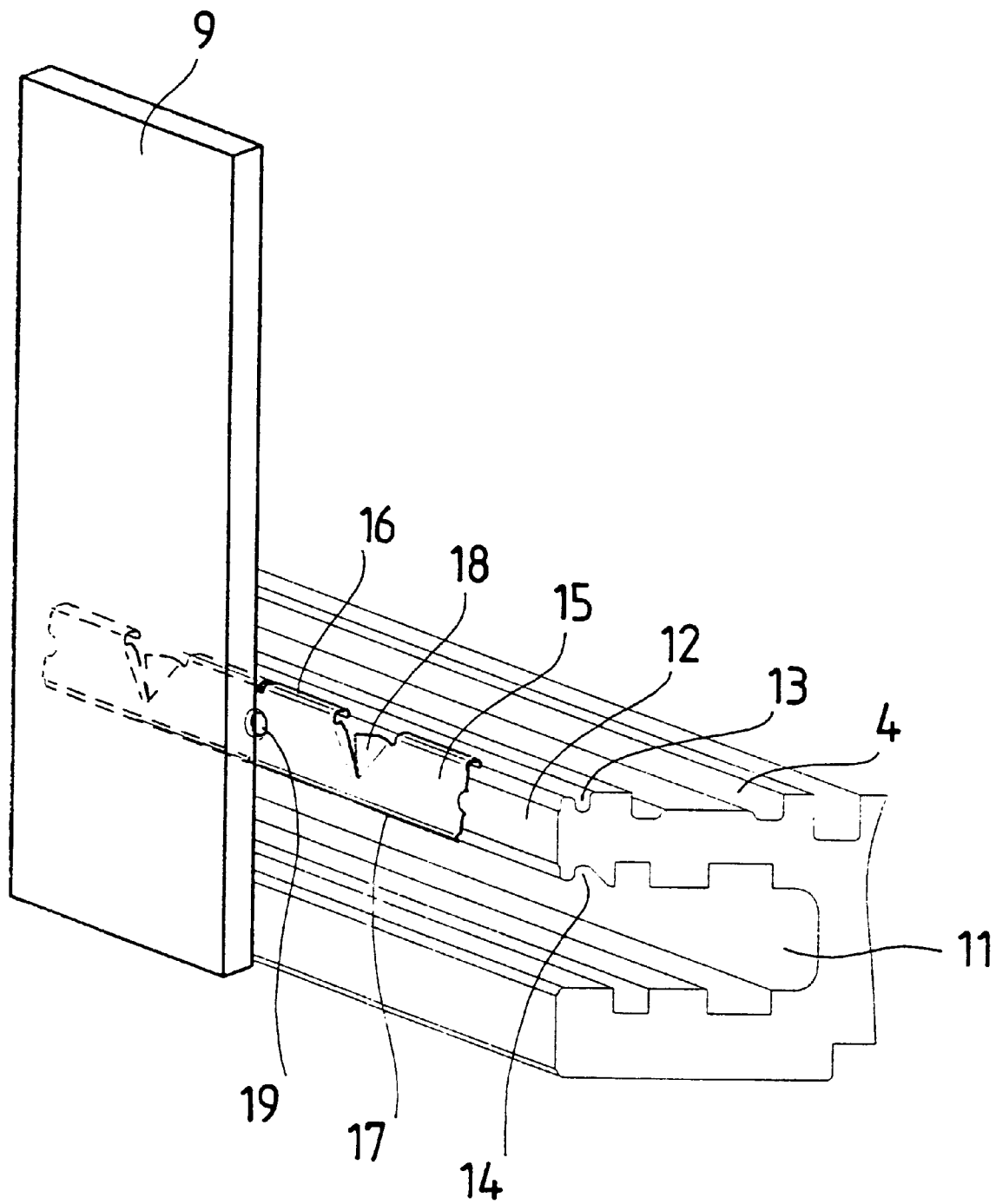
FIG. 2 shows the contacting of a module rail to a front plate.

FIG. 2 schematically shows the contacting between a module rail 4 and a front plate 9 of a plug-in module 10 in accordance with the invention. The module rail 4 has a forwardly opened groove 11 into the inner widened region of which a threaded-hole-strip 24, shown in FIG. 1, (not shown in FIG. 2) is inserted. A mounting screw (also not shown) can be inserted through a mounting opening in the front plate 9 and screwed into a threaded hole in the threaded-hole-strip to secure the inserted plug-in module 10.

The module rail 4 comprises a smoothly milled seating surface 12 above the groove 11. An upper engagement groove 13 and a lower engagement groove 14 can be seen behind this seating surface 12. A resilient contact band 15 seats on the seating surface 12 and consists essentially of flat stainless steel sheet metal the upper edge 16 and lower edge 17 of which are bent in such a manner that that they engage into the upper engagement groove 13 and the lower engagement groove 14, respectively. The resilient contact band 15 is only connected to the module rail 4 through the snapping onto the seating surface 12. The forward facing break-outs 18 of the resilient contact band 15 can be clearly seen. These establish the electrical contact with the front plate 9. Also clearly visible are the contact spikes 19 facing towards the seating surface 12 which guarantee electrical contact to the module rail 4.

Figure 3:
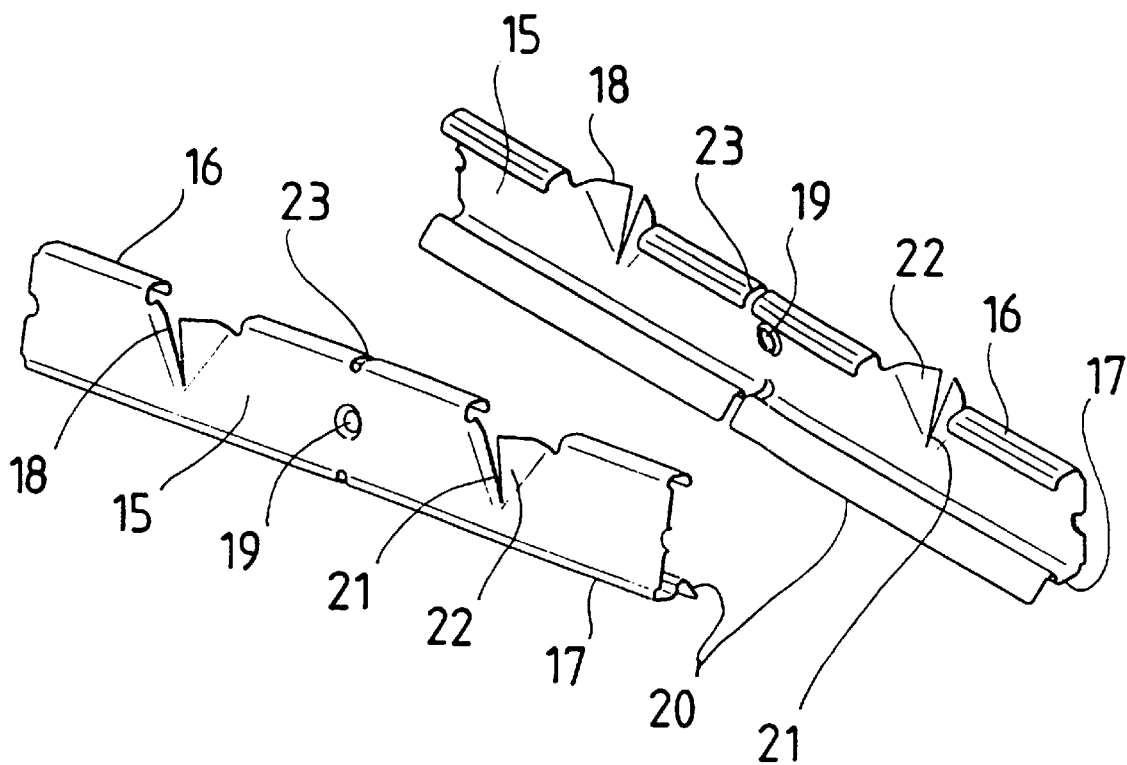
FIG. 3 shows a perspective view of two resilient contact bands.

FIG. 3 shows a perspective view of two resilient contact bands 15. They consist essentially of stainless steel sheet metal the upper edges 16 of which are doubly bent. The lower edges 17 of the sheet metal are doubly bent in a corresponding manner and extend into an abutment diagonal 20. In the middle of each resilient contact band 15, one recognizes a sharp-edged material protuberance which serves as contact spike 19. In each case, two break-outs 18 are shown adjacent thereto, each of which consists essentially of a vertical cut 21 and two triangularly bent leaf springs 22. Both resilient contact bands 15 shown have two equal sections which can be separated from each other through simple break-off at an intended breaking location 23. The resilient contact band 15 to be used for a module support structure normally comprises more than two sections separated by one intended breaking location 23.

Figure 4:
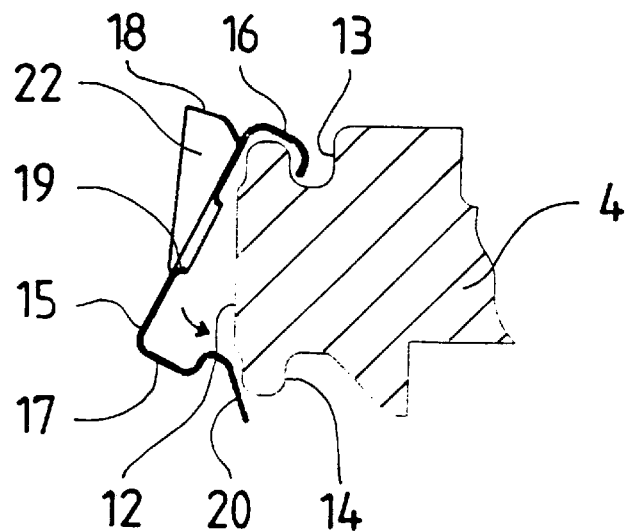
FIG. 4 shows a cross section through a resilient contact band which can be snapped-onto a module rail.

FIG. 4 illustrates the snapping of a resilient contact band 15 onto a module rail 4. The resilient contact band 15, having the easily recognizable contact spikes 19 and break-outs 18 with the leaf springs 22, is initially placed into the upper engagement groove 13 of the module rail 4 at its upper doubly bent edge 16. The likewise doubly bent lower edge 17 of the resilient contact band 15 is then snapped into the lower engagement groove 14 with the assistance of the abutment diagonal 20. The resilient contact band 15 then seats on the seating surface 12 of the module rail 4 and is held by the elasticity of the stainless steel.

SUMMARY OF REFERENCE SYMBOLS 1 module support structure
2 printed circuit board
3 side walls
4 module rails
5 mounting bolts
6 slotted holes
7 guide rails
8 guide groove
9 front plate
10 plug-in module
11 groove
12 seating surface
13 upper engagement groove
14 lower engagement groove
15 resilient contact band
16 upper edge
17 lower edge
18 break-outs
19 contact spikes
20 abutment diagonal
21 cut
22 leaf springs
23 intended breaking location

What is claimed:

1. A shielded circuit board module support structure inserted on guide rails, comprising:

two parallel metallic side walls and at least four parallel metallic module rails connecting the side walls and supporting the guide rails, wherein printed circuit boards are assembled into plug-in modules, each module having a removable front plate, wherein the module rails comprise a groove opening towards a front of the module support structure adapted for accepting a threaded-hole-strip and at least one seating surface for the front plates of the plug-in modules, wherein the module rails (4) comprise, behind their seating surfaces (12), an upper engagement groove (13), a lower engagement groove (14); and resilient contact bands (15) which snap onto the seating surface (12) and which snap-in in an elastic manner behind the seating surface (12) into the engagement grooves (13, 14) and have a plurality of break-outs (18) resiliently disposed facing the front of the module support structure (1) and a plurality of contact spikes (19) facing the seating surface (12).

2. The shielded module support structure of claim 1, wherein the resilient contact bands (15) comprise flat sheet metal, having upper and lower edges (16,17) which bend such that they engage the respective engagement grooves (13, 14) of the associated module rail (4).

3. The shielded module support structure of claim 1, wherein the break-outs (18) of the resilient contact bands (15) comprise a substantially vertical cut (21) and two triangular-shaped leaf springs (22) bent away from the cut (21).

4. The shielded module support structure of claim 3, wherein the leaf springs (22) are adapted to remain within an elastic deformation range when the leaf springs (22) are pressed onto the seating surface (12) of the module rail (4).

5. The shielded module support structure of claim 1, wherein the contact spikes (19) of the resilient contact bands (15) are formed from sharp-edged material protuberances.

6. The shielded module support structure of claim 1, wherein the resilient contact bands (15) comprise a plurality of equal length sections and an intended breaking location (23) disposed between each section.

7. The shielded module support structure of claim 1, wherein the resilient contact bands (15) comprise lower edges which are extended via abutment diagonals (20).

8. The shielded module support structure of claim 1, wherein the resilient contact bands (15) comprise chrome-nickel steel.

9. The shielded module support structure of claim 1, wherein the seating surfaces (12) of the module rails (4) are, at least in sections, milled smooth or polished.

10. A shielded module support structure on guide rails, comprising:

two parallel metallic side walls;
at least four parallel metallic module rails connecting the side walls and supporting the guide rails;
at least one module having a removable front plate, the module rails having a groove opening towards a front of the module support structure and at least one receiving surface for the front plates of the module, wherein the module rails have seating surfaces with an upper engagement groove and a lower engagement groove; and resilient contact bands snappable onto a seating surface and one of the engagement grooves, the module rails including a plurality of breakouts resiliently disposed facing the front of the module support structure, and a plurality of contact spikes facing the seating surface.

11. The shielded module support structure of claim 10, wherein a groove opening towards the front of the module support structure is adapted for receiving a threaded hole strip.

12. The shielded module support structure of claim 1, wherein the resilient contact bands comprise flat sheet metal having upper and lower edges that bend to engage the respective engagement grooves of an associated module rail.

13. The shielded module support structure of claim 1, wherein the break-outs comprise a substantially vertical slot and triangular shaped leaf springs bent away from the slot.

14. The shielded module support structure of claim 13, wherein the leaf springs are adapted to remain in a deformed state when the leaf springs are pressed under the seating surface of the module rail.

15. The shielded module support structure of claim 1, wherein the resilient contact bands comprise a plurality of sections with a relief notch disposed intermediate adjacent sections.

16. The shielded module support structure of claim 1, wherein resilient contact bands include lower edges extending diagonally downward.

* * * * *